United States Patent [19]
Johnson

[11] Patent Number: 4,588,903
[45] Date of Patent: May 13, 1986

[54] AMORPHOUS SEMICONDUCTOR DEVICES HAVING INCREASED SWITCHING SPEED DUE TO DYNAMIC SIGNAL CONDITIONING

[75] Inventor: Robert R. Johnson, Franklin, Mich.

[73] Assignee: Energy Conversion Devices, Inc., Troy, Mich.

[21] Appl. No.: 544,582

[22] Filed: Oct. 24, 1983

[51] Int. Cl.[4] .................. H03K 17/04; H03K 19/08
[52] U.S. Cl. ........................... 307/240; 307/256; 307/460; 307/479; 307/480; 307/317 R; 357/2; 357/4
[58] Field of Search ............... 307/440, 445, 446, 450, 307/460, 465, 472, 479, 480, 240, 256, 317 R; 357/2, 4, 58; 364/784; 365/163

[56] References Cited

U.S. PATENT DOCUMENTS

| | | | |
|---|---|---|---|
| 4,389,713 | 6/1983 | Patel et al. | 357/2 X |
| 4,438,351 | 3/1984 | Schuermeyer | 307/291 X |
| 4,485,389 | 11/1984 | Ovshinsky et al. | 357/4 X |
| 4,499,557 | 2/1985 | Holmberg et al. | 365/163 |

OTHER PUBLICATIONS

Fritzsche, "Physics of Instabilities in Amorphous Semiconductors", IBM J. Res. Develop., Sep. 1969, pp. 515-521.
Vogel et al, "Negative Capacitance in Amorphous Semiconductor Chalcogenide Thin Films", Applied Physics Letters, vol. 14, No. 7, Apr. 1969, pp. 216-218.
M. Matsumura, et al., "Switching Characteristics of Amorphous-Silicon Field-Effect-Transistors", Japanese Journal of Applied Physics, vol. 20, pp. L414-L416 (Jun. 1981).

Primary Examiner—Stanley D. Miller
Assistant Examiner—D. R. Hudspeth
Attorney, Agent, or Firm—Lawrence G. Norris; Robert S. Nolan; Richard O. Gray, Jr.

[57] ABSTRACT

A high speed digital electronic system includes a plurality of logic or switching circuits for providing one or more bits of discrete output in response to applied input signals. At least some of the circuits include devices switchable between at least two logic states, and are formed from materials of the type which exhibit increased switching speeds when maintained in a dynamic mode of operation. Signal source means apply to the system dynamic signals for maintaining the switchable devices in a dynamic mode of operation. The switchable devices are preferably formed from amorphous semiconductor alloys including silicon and may take the form of diodes to form AC logic AND gates, OR gates or a matrix selection circuit. The dynamic signals take the form of alternating major and minor clock pulses having a frequency between 10 and 40 megahertz. The logic circuits are arranged to form a binary adder.

23 Claims, 16 Drawing Figures

AMORPHOUS SEMICONDUCTOR DEVICES HAVING INCREASED SWITCHING SPEED DUE TO DYNAMIC SIGNAL CONDITIONING

BACKGROUND OF THE INVENTION

1. Field of the Invention

The present invention relates to an electronic logic system of the type including a plurality of logic or switching circuits wherein at least some of the logic or switching circuits include devices formed from amorphous semiconductor alloy materials. The system of the present invention provides high speed operation of the logic or switching circuits at rates not heretofore obtained with amorphous semiconductor devices.

2. Description of the Prior Art

Silicon is the basis of the huge crystalline semiconductor industry and is the material which is utilized in substantially all the commercial integrated circuits now produced. When crystalline semiconductor technology reached a commercial state, it became the foundation of the present huge semiconductor device manufacturing industry. This was due to the ability of the scientist to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type.

The semiconductor fabrication processes for making p-n junction crystals involve extremely complex, time consuming and expensive procedures as well as high processing temperatures. Thus, these crystalline materials used in transistors and other current control devices are produced under very carefully controlled conditions by growing individual single silicon or germanium crystals, where p-n junctions are required by doping such single crystals with extremely small and critical amounts of dopants. These crystal growing processes produce relatively small crystal wafers upon which the integrated circuits are formed.

In conventional integrated circuit technology the small area crystal wafer limits the overall size of the integrated circuit which can be formed thereon. In applications requiring large scale areas, such as in the display technology, the crystal wafers cannot be manufactured with as large areas as required or desired. The devices are formed, at least in part, by diffusing p or n-type dopants into the substrate. Further, each device is formed between isolation channels which are diffused into the substrate. Packing density (the number of devices per unit area of wafer surface) is also limited on the silicon wafers, because of limitations in leakage current in each device and the power necessary to operate the devices, each of which generate heat which is undesirable. The silicon wafers do not readily dissipate heat. Also, the leakage current adversely affects the battery or power cell lifetime in portable applications.

In MOS type circuitry the switching speed is related directly to the gate length with the smallest length having the highest speed. The diffusion processes, photolithography and other crystalline manufacturing processes limit how short the gate length can be made.

Further, the packing density is extremely important because the cell size is exponentially related to the cost of each device.

In summary, crystal silicon transistor and integrated circuits have parameters which are not variable as desired, require large amounts of material, high processing temperatures, are only producible on relatively small area wafers and are expensive and time consuming to produce. Devices based upon amorphous silicon alloys can eliminate these crystal silicon disadvantages. Amorphous silicon alloys are easier to manufacture than crystalline silicon and can be manufactured at lower temperatures and in larger areas.

Accordingly, a considerable effort has been made to develop processes for readily depositing amorphous semiconductor alloys or films each of which can encompass relatively large areas, if desired, limited only by the size of the deposition equipment, and which could be doped to form p-type and n-type materials to form p-n junction transistors and devices superior in cost and/or operation to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films resulted in such films not being successfully doped or otherwise modified to shift the Fermi level close to the conduction or valence bands making them unsuitable for making p-n junctions for transistors and other current control device applications.

In an attempt to minimize the aforementioned problems involved with amorphous silicon and germanium, W. E. Spear and P. G. Le Comber of Carnegie Laboratory of Physics, University of Dundee, in Dundee, Scotland did some work on "Substitutional Doping of Amorphous Silicon", as reported in a paper published in Solid State Communications, Vol. 17, pp. 1193–1196, 1975, toward the end of reducing the localized states in the energy gap in amorphous silicon or germanium to make the same approximate more closely intrinsic crystalline silicon or germanium and of substitutionally doping the amorphous materials with suitable classic dopants, as in doping crystalline materials, to make them extrinsic and of p or n conduction types.

The reduction of the localized states was accomplished by glow discharge deposition of amorphous silicon films wherein a gas silane ($SiH_4$) was passed through a reaction tube where the gas was decomposed by an r.f. glow discharge and deposited on a substrate at a substrate temperature of about 500°–600° K. (227°–327° C.). The material so deposited on the substrate was an intrinsic amorphous material consisting of silicon and hydrogen. To produce extrinsic amorphous material a gas of phosphine ($PH_3$) for n-type conduction or a gas of diborane ($B_2H_6$) for p-type conduction were premixed with the silane gas and passed through the glow discharge reaction tube under the same operating conditions. The gaseous concentration of the dopants used was between about $5 \times 10^{-6}$ and $10^{-2}$ parts per volume. The material so deposited included supposedly substitutional phosphorus or boron dopant and was shown to be extrinsic and of n or p conduction type.

While it was not known by these researchers, it is now known by the work of others that the hydrogen in the silane combines at an optimum temperature with many of the dangling bonds of the silicon during the glow discharge deposition, to substantially reduce the density of the localized states in the energy gap toward the end of making the electronic properties of the amorphous material approximate more nearly those of the corresponding crystalline material.

After the development of the glow discharge deposition of silicon from silane gas was carried out, work was done on the sputter deposition of amorphous silicon films in the atmosphere of a mixture of argon (required by the sputtering deposition process) and molecular hydrogen, to determine the results of such molecular hydrogen on the characteristics of the deposited amorphous silicon film. This research indicated that the hydrogen acted as a compensating agent which bonded in such a way as to reduce the localized states in the energy gap. However, the degree to which the localized states in the energy gap were reduced in the sputter deposition process was much less than that achieved by the silane deposition process described above. The above described p and n dopant materials also were introduced in the sputtering process to produce p and n doped materials. These materials had a lower doping efficiency than the materials produced in the glow discharge process.

Various methods of fabrication and construction of thin film transistors and devices have been proposed wherein the various films of the transistor are made of different materials having different electrical characteristics. For example, thin film transistors have been proposed utilizing nickel oxide films, silicon films, amorphous silicon films and amorphous silicon and hydrogen films formed from silane as above mentioned. Also, various geometrical configurations have been proposed such as a planar-MOS construction.

Greatly improved amorphous silicon alloys having significantly reduced concentrations of localized states in the energy gaps thereof and high quality electronic properties have been prepared by glow discharge as fully described in U.S. Pat. No. 4,226,898, Amorphous Semiconductors Equivalent to Crystalline Semiconductors, Stanford R. Ovshinsky and Arun Madan which issued Oct. 7, 1980, and by vapor deposition as fully described in U.S. Pat. No. 4,217,374, Stanford R. Ovshinsky and Masatsugu Izu, which issued on Aug. 12, 1980, under the same title. As disclosed in these patents, fluorine is introduced into the amorphous silicon semiconductor alloy to substantially reduce the density of localized states therein. Activated fluorine especially readily diffuses into and bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine also combines in a preferable manner with silicon and hydrogen, utilizing the hydrogen in a more desirable manner, since hydrogen has several bonding options. Without fluorine, hydrogen may not bond in a desirable manner in the material, causing extra defect states in the band gap as well as in the material itself. Therefore, fluorine is considered to be a more efficient compensating or altering element than hydrogen when employed alone or with hydrogen because of its high reactivity, specificity in chemical bonding, and high electronegativity.

As an example, compensation may be achieved with fluorine alone or in combination with hydrogen with the addition of these element(s) in very small quantities (e.g., fractions of one atomic percent). However, the amounts of fluorine and hydrogen most desirably used are much greater than such small percentages so as to form a silicon-hydrogen-fluorine alloy. Such alloying amounts of fluorine and hydrogen may, for example, be in the range of 1 to 5 percent or greater. It is believed that the alloy so formed has a lower density of defect states in the energy gap than that achieved by the mere neutralization of dangling bonds and similar defect states.

Unfortunately, as reported by Le Comber and Spear and others, the silane based transistor devices had switching frequency speeds of about only $10^4$ Hz. As a result, while transistor devices made from amorphous silicon alloys are desirable from the standpoint of ease of manufacture, small size, and the ability to be made over large areas, their switching speeds have not been fast enough for high speed applications such as computer logic applications.

In view of the extreme commercial value and importance of solid state devices made from amorphous semiconductor alloys, considerable work has been done to improve the switching speeds of these devices. Matsumura, for example, as reported in *Japanese Journal of Applied Physics*, Vol. 20, No. 6, June, 1981 at pp. L414–L416, has theorized that under dynamic conditions the mobility of these devices becomes high and that relatively high speed switching is possible. However, in that publication, Matsumura merely theorized the existence of this phenomenon and did not show or suggest any way to take advantage of this theorized characteristic in a device or circuit.

SUMMARY OF THE INVENTION

The invention provides an improvement affording high speed operation of an electronic logic system of the type including a plurality of logic or switching circuits for providing one or more bits of discrete output in response to applied input signals. The improvement comprises at least some of the circuits including devices switchable between at least two logic states, the devices being formed from materials of the type which exhibit increased switching speeds when in a dynamic mode of operation, and signal source means for applying to the system dynamic signals for maintaining the switchable devices in a dynamic mode of operation.

The materials from which the devices are formed preferably are amorphous semiconductor alloy materials including silicon and the switchable devices preferably comprise amorphous silicon diodes. The diodes can be arranged to form AND gates or OR gates. The diodes can also be arranged to perform matrix selection functions in an electronic matrix memory array.

The dynamic signals preferably have a fixed frequency and continuously vary in amplitude or take the form of clock pulses having a frequency greater than 0.5 megahertz and preferably between 10 and 40 megahertz. Also, the system can include a clock generator arranged to provide alternating major and minor clock pulses. The circuits can comprise, for example, logic circuits arranged to form a binary adder.

The invention further provides a method of operating an electronic logic system of the type including a plurality of logic or switching circuits which provide one or more bits of discrete output in response to applied input signals. The method provides high speed operation of the logic system and includes the steps of providing a plurality of devices switchable between at least two logic states formed from materials and of the type which exhibit increased switching speeds when operated in a dynamic mode of operation, coupling said switchable devices together to form the circuits, and thereafter, applying to the system dynamic signals which maintain the switchable devices in a dynamic mode of operation.

DESCRIPTION OF THE PREFERRED EMBODIMENT

Figure 1:
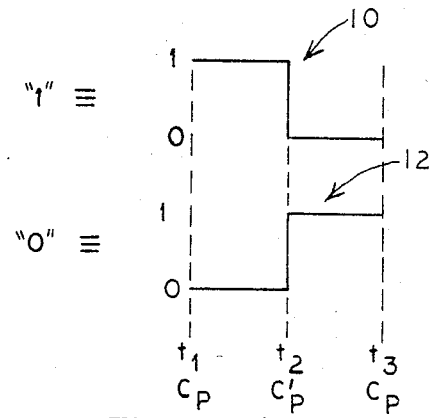
FIG. 1 illustrates representative 1 and 0 logic states of a Manchester A.C. logic system of the type which can be utilized in practicing the present invention.

Referring now to FIG. 1, it illustrates representative logic 1 and 0 states during a time interval from $t_1$ to $t_3$ for an AC Manchester logic system. A logic system of this type is one wherein alternating major and minor clock pulses are continuously impressed on the logic circuits and wherein the bit time intervals are defined as being between the major clock pulses. The major clock pulses set the logic circuits to the proper logic level and the minor clock pulses invert the levels set by the major clock pulses. Hence, waveform 10, which represents a logic 1 state in the time interval from $t_1$ to $t_3$, is at a logic 1 level set by the major clock pulse ($C_p$) at $t_1$, is inverted to a logic 0 level by the minor clock pulse $C_p'$ at $t_2$ and continues at that level until $t_3$. At $t_3$, the beginning of a new bit time interval, if the proper logic state continues to be a 1 level, the waveform 10 will return to the logic 1 level and if the proper logic state is now a 0 level, the waveform will remain at the 0 level.

The waveform 12 illustrates the logic 0 level. At $t_1$, the major clock pulse $C_p$ sets the state to the 0 level, at $t_2$ the minor clock pulse $C_p'$40 inverts the state to a 1 level. At $t_3$, the next major clock pulse will set the state to the proper level for the next bit time interval.

Figure 2:
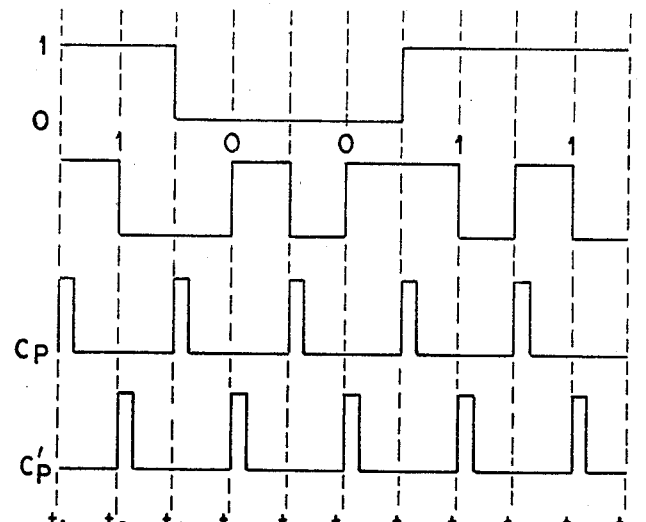
FIG. 2 illustrates a representive D.C. logic waveform, a corresponding A.C. logic waveform containing a series of A.C. logic 1 and 0 levels, and waveforms representing the major and minor clock pulses.

Referring now to FIG. 2, it illustrates a DC logic waveform which is a level 1 in the bit time interval from $t_1$ to $t_3$, a level 0 in the bit time intervals from $t_3$ to $t_5$ and $t_5$ to $t_7$, and a level 1 in the bit time intervals from $t_7$ to $t_9$ and $t_9$ to $t_{11}$. The waveform below the DC logic waveform is the equivalent AC logic waveform. As can be seen, at times $t_1$, $t_3$, $t_5$, $t_7$ and $t_9$, the major clock pulses ($C_p$) set the AC logic waveform to the proper levels. The minor clock pulses occuring at times $t_2$, $t_4$, $t_6$, $t_8$, and $t_{10}$, or midway through each bit time interval, reverse the levels set by the major clock pulses. As a result, the AC logic waveform illustrated in FIG. 2 is obtained. As can be noted, with AC logic, the devices creating the waveforms must be switched between the logic states at least once for each bit time interval. It is this switching by the clock pulses that maintains the logic or switching devices in the dynamic mode.

As used herin, the major and minor clock pulses are among many different types of signals which can act as dynamic signals. Disclosed hereinafter are circuits and a system of circuits which incorporate amorphous semiconductor switchable devices which exhibit high speed operation when maintained in a dynamic mode of operation. That is to say, these devices will exhibit fast switching speeds and provide a significant portion of the maximum available current at a given voltage when precluded from settling into a steady state off condition. This can be accomplished by, for example, continuously switching the devices between an on and off condition at frequency rates greater than 0.5 megahertz and preferably between ten and forty megahertz to maintain at least fifty percent of the maximum obtainable current at that voltage. More generally, as has been determined experimentally, in the case of switchable devices formed from amorphous semiconductor alloys, these devices can be precluded from settling into a steady state condition, and thus can be maintained in a dynamic mode, as long as the off time, the time period from the time in which the devices are turned off to the time in which they are once again turned on, is about 2 microseconds or less. As a result, any signals which can cause such on and off transitions in these devices are considered to be dynamic signals. Such signals can have sinusoidal, sawtooth or other waveforms. Preferably, the dynamic signals have a fixed frequency, but such is not essential. For example, the dynamic signals could be of variable frequency wherein phase detectors in combination with suitable activating circuits are utilized for causing the on and off transitions.

Figure 5:
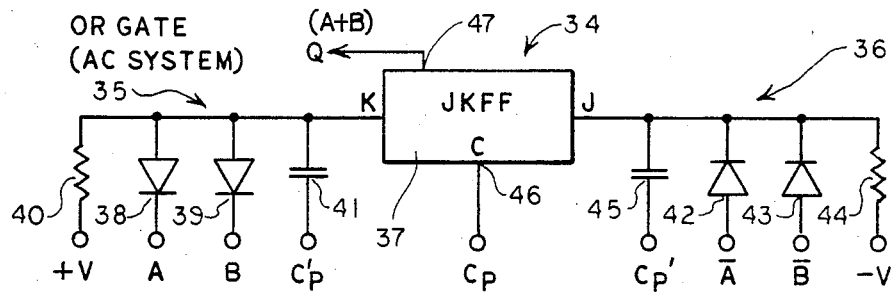
FIG. 5 is a circuit diagram of an A.C. logic system OR gate.

As will be described hereinafter, the circuits Of FIGS. 7 through 15, when combined as indicated, form a binary adder which illustrates the operation of the present invention. The binary adder utilizes AC logic AND gates and OR gates as the main logic circuits. These circuits include switching diodes formed from amorphous semiconductor alloys. Representative AND gates and OR gates of this type are shown in FIGS. 3 and 5, respectively.

Figure 3:
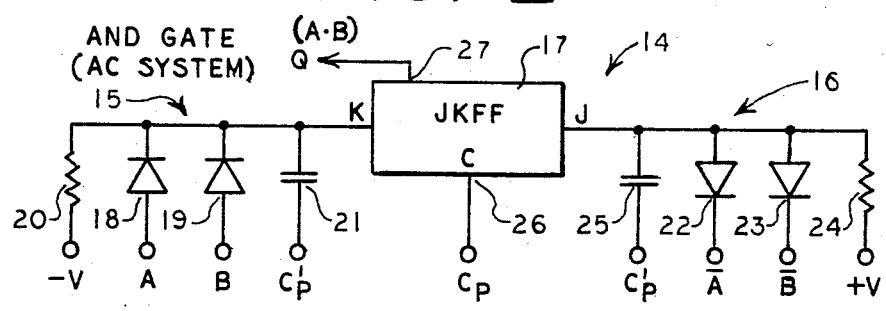
FIG. 3 is a circuit diagram of an A.C. logic system AND gate.

Referring now to FIG. 3, the AC logic AND gate 14 thereshown includes a first gate 15, a second gate 16, and a JK flip-flop 17. The first gate 15 can be recognized as an OR gate for DC logic and the second gate 16 can be recognized as an AND gate for DC logic. The DC logic OR gate 15 includes a pair of diodes 18 and 19 and a resistor 20. The cathodes of the diodes 18 and 19 are coupled together to form an output which is coupled to the K input of the JK flip-flop 17. The anodes of the diodes 18 and 19 comprise the inputs of the gate 15 and are adapted to be coupled to sources of logic signals represented by A and B. The resistor 20 is coupled between the K input and a power supply ($-V$). The minor clock pulses $C_p$40 are capacitively coupled to the K input of JK flip-flop 17 by a capacitor 21.

The DC logic AND gate 16 includes a pair of diodes 22 and 23 and a resistor 24. The anodes of the diodes 22 and 23 are coupled together to form an output which is coupled to the J input of the JK flip-flop 17. The cathodes of the diodes 22 and 23 comprise the inputs of the gate 16 and are adapted to be coupled to be coupled to sources of logic signals represented by the complements of A and B, or $\overline{A}$ and $\overline{B}$. The resistor 24 is coupled between the J input and a power supply (+V). The minor clock pulses $C_p'$ are capacitively coupled to the J input by a capacitor 25.

Lastly, the clock input 26 of the JK flip-flop 17 is coupled to the major clock pulses $C_p$. As will be seen in the truth table of FIG. 4, the AC logic AND gate 14 of FIG. 3 provides at its Q output 27 AC logic signals representing A·B.

Figure 4:
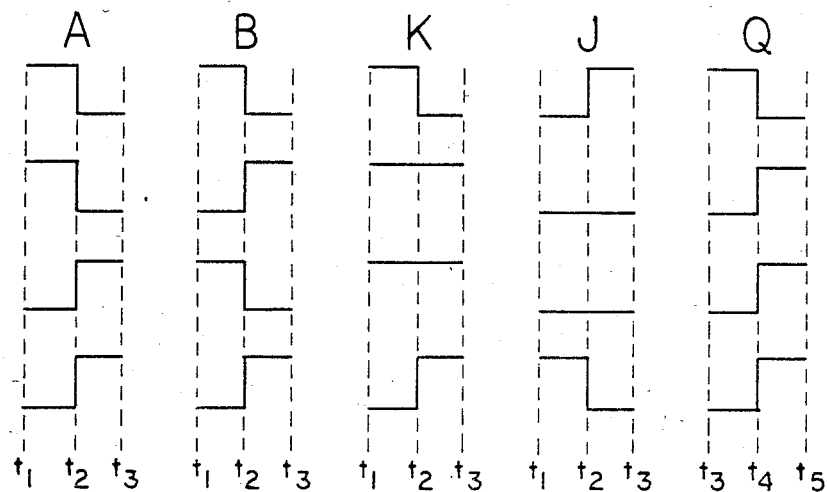
FIG. 4 is a truth table for the A.C. logic system AND gate of FIG. 3.

Referring now to the truth table of FIG. 4, and by maintaining the convention that the major clock pulses $C_p$ occur at the odd numbered times, $t_1$, $t_3$, and $t_5$, and the minor clock pulses $C_p'$ occur at the even numbered times $t_2$ and $t_4$, it can be seen that the J and K inputs of the flip-flop are set between times $t_2$ and $t_3$ so that upon the occurrence of a major clock pulse at $t_3$, the Q output is set to the proper level. At $t_4$, the next minor clock pulse $C_p'$ occurs and toggles the flip-flop. As a result, the Q output of the flip-flop provides A·B in AC logic form, but displaced in time from the original input conditions by one major clock pulse period.

FIG. 5 shows an AC logic OR gate 34. It includes a DC logic AND gate 35, and DC logic OR gate 36, and a JK flip-flop 37. The DC logic AND gate 35 includes a pair of diodes 38 and 39 and a resistor 40. The anodes of diodes 38 and 39 are coupled together to form an output which is coupled to the K input of flip-flop 37. The cathodes of the diodes 38 and 39 comprise the inputs of the gate 35 and are adapted to be coupled to sources of logic signals represented by A and B. The resistor 40 is coupled between the K input and a power supply (+V). The minor clock pulses $C_p'$ are capacitively coupled to the K input by a capacitor 41.

The DC logic OR gate 36 includes a pair of diodes 42 and 43 and a resistor 44. The cathodes of the diodes 42 and 43 are coupled together to form an output which is coupled to the J input of the JK flip-flop 37. The anodes of the diodes 42 and 43 comprise the inputs of the gate 36 and are adapted to be coupled to sources of logic signals represented by the complements of A and B, or $\overline{A}$ and $\overline{B}$. The resistor 44 is coupled between the J input and a power supply (−V). The minor clock pulses $C_p'$ are capacitively coupled to the J input by a capacitor 45.

Figure 6:
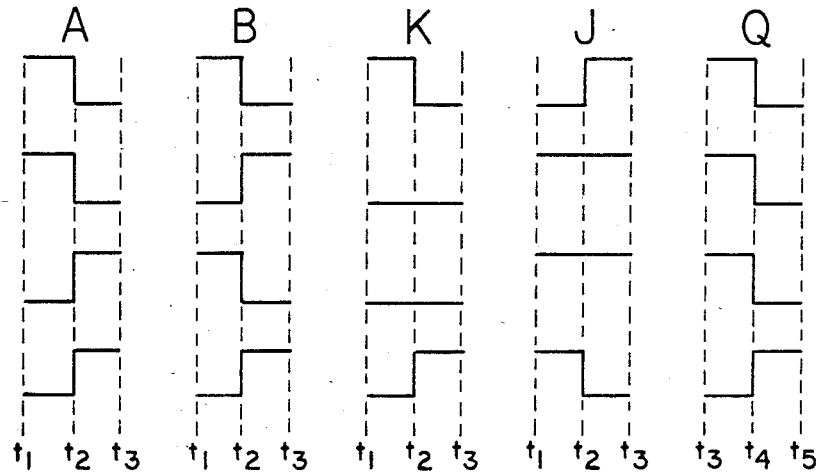
FIG. 6 is a truth table for the A.C. logic system OR gate of FIG. 5.

Lastly, the clock input 46 of the JK flip-flop 37 is coupled to the major clock pulses $C_p$. As will be seen in the truth table of FIG. 6, the AC logic OR gate 34 of FIG. 5 provides at its Q output 47 AC logic signals representing A+B.

Referring now to the truth table of FIG. 6, and again by maintaining the convention that the major clock pulses $C_p$ occur at the odd numbered times, $t_1$, $t_3$, and $t_5$, and the minor clock pulses $C_p'$ occur at the even numbered times $t_2$ and $t_4$, it can be seen that the J and K inputs of the flip-flop are set between times $t_2$ and $t_3$ so that upon the occurrence of a major clock pulse at $t_3$, the Q output is set to the proper level. At $t_4$, the next minor clock pulse $C_p'$ occurs and toggles the flip-flop. As a result, the Q output of the flip-flop provides A+B in AC logic form, but again is displaced in time from the original input conditions by one major clock pulse period.

The diodes of the AC logic AND gate 14, the diodes of the AC logic OR gate 34, and the diodes of the circuits of FIGS. 7 through 15 to be described hereinafter, are preferably formed from amorphous silicon alloys and of a p-i-n configuration. Such diodes can be made, for example, as disclosed in copending U.S. application Ser. No. 458,919, filed Jan. 18, 1983, in the name of the inventor herein, for Electronic Matrix Arrays and Method For Making The Same, and which is assigned to the assignee of the present invention. In that application, not only is a unique method disclosed for making the diodes over a large substrate area, but also, a method for interconnecting them is additionally disclosed.

The diodes can provide high speed switching and thus high speed logic operations as long as they are maintained in a dynamic mode of operation, as previously referred to. Such will be the case given AC logic input signals as represented in FIG. 1 wherein the clock pulses occur at rates of at least 0.5 megahertz.

FIGS. 7 through 15 show an extremely useful logic circuit embodying the present invention. When taken together as indicated, the circuits of FIGS. 7 through 15 form a serial binary adder which performs the boolean operation of:

$$S = ABC + \overline{A}\overline{B}C + \overline{A}B\overline{C} + A\overline{B}\overline{C}.$$

C is a "carry" represented by:

$$C = AB + C_{-1}(A+B) = AB + C_{-1}A + C_{-1}B.$$

where:

$C_{-1}$ is C from the previous bit time interval.

Figure 7:
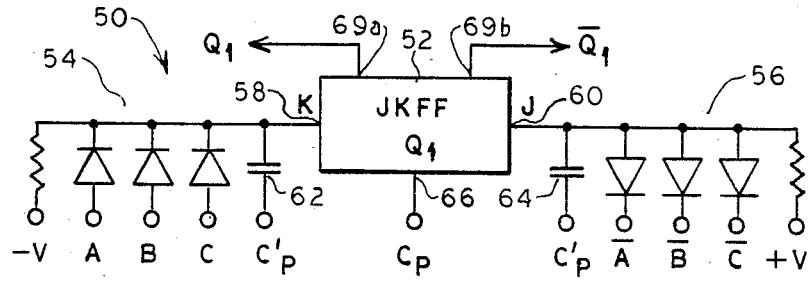
FIGS. 7 through 15 are schematic circuit diagrams which form a binary adder when taken together as indicated and which embody both the system and method aspects of the present invention.

The circuit 50 of FIG. 7 provides a logic output $Q_1$, corresponding to A B C. It includes a JK flip-flop 52, a DC logic OR gate 54, and a DC logic AND gate 56. The output of the gate 54 is coupled to the K input 58 of flip-flop 52 and the output of the gate 56 is coupled to the J input 60. The inputs of the gate 54 are coupled to logic sources which provide logic signals corresponding to A, B, and C. The inputs of the gate 56 are coupled to logic sources which provide logic signals corresponding to $\overline{A}$, $\overline{B}$, and e,ovs/C/ . The minor AC logic clock pulses $C_p'$ are coupled to the J and K inputs 60 and 58 by capacitors 64 and 62. The major AC logic clock pulses $C_p$ are coupled to the clock input 66. The output 69a provides $Q_1$, which is A B C and output 69b provides $\overline{Q_1}$, which is $\overline{A\ B\ C}$.

Figure 8:
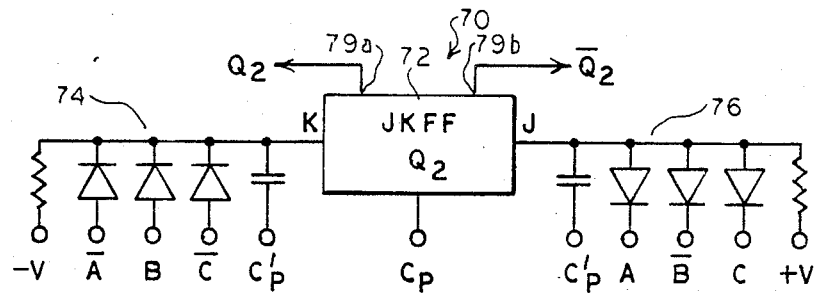

In a similar manner, the circuit 70 of FIG. 8 provides a logic output $Q_2$ corresponding to $\overline{A}$ B $\overline{C}$. It includes a JK flip-flop 72, a DC logic OR gate 74, and a DC logic AND gate 76. The inputs of gate 74 are coupled to logic sources providing $\overline{A}$, B, and $\overline{C}$ while the inputs of gate 76 are coupled to logic sources providing A, $\overline{B}$, and C. Like the circuit 50 of FIG. 7, the minor clock pulses $C_p'$ are capacitively coupled to the J and K inputs of flip-flop 72 and the major clock pulses $C_p$ are coupled to the clock input of flip-flop 72. The output 79a of flip-flop 72 thereby provides $Q_2$ which is $\overline{A}$ B $\overline{C}$, and output 79b provides $\overline{Q_2}$ which is A $\overline{B}$ C.

Figure 9:
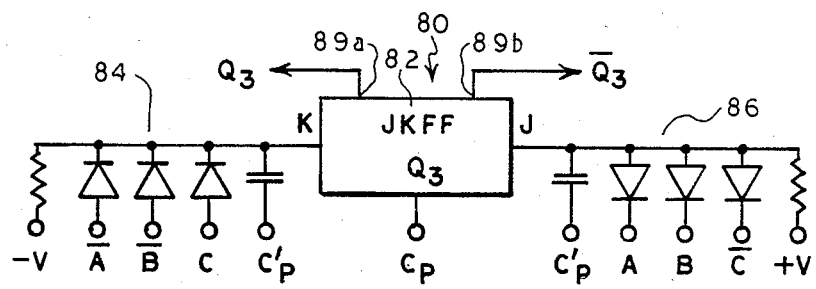

Similarly, the circuit 80 of FIG. 9 provides a logic output $Q_3$ corresponding to $\overline{A}$ $\overline{B}$ C. It includes a JK flip-flop 82, a DC logic OR gate 84, and a DC logic AND gate 86. The inputs of gate 84 are coupled to logic sources providing $\overline{A}$, $\overline{B}$, and C while the inputs of gate 86 are coupled to logic sources providing A, B, and $\overline{C}$.

Like the previous circuits, the minor clock pulses $C_p'$ are capacitively coupled to the flip-flop J and K inputs and the major clock pulses $C_p$ are coupled to the flip-flop clock input. The output 89a of flip-flop 82 thereby provides $\overline{Q_3}$ which is $\overline{A}\ \overline{B}\ C$ and output 89b provides $\overline{\overline{Q_3}}$ which is A B C.

Figure 10:
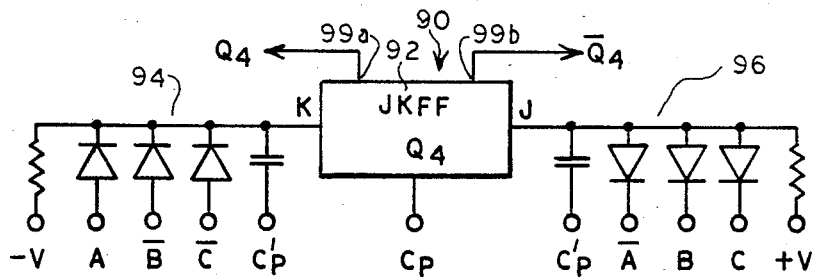

In a still similar manner, the circuit 90 of FIG. 10 provides a logic output $\overline{Q_4}$ corresponding to A $\overline{B}\ \overline{C}$. It includes a JK flip-flop 92, a DC logic OR gate 94, and a DC logic AND gate 96. The inputs of gate 94 are coupled to logic sources providing A, $\overline{B}$, and $\overline{C}$ while the inputs of gate 96 are coupled to logic sources providing $\overline{A}$, B and C. Again, the minor clock pulses $C_p'$ are capacitively coupled to the J and K inputs and the major clock pulses $C_p$ are coupled to the clock input of flip-flop 92. The output 99a of flip-flop 92 thereby provides $Q_4$ which is A $\overline{B}\ \overline{C}$ and output 99b provides $\overline{Q_4}$ which is $\overline{A}$ B C.

As previously mentioned, C is the carry and is given by: $C = AB + C_{-1}A + C_{-1}B$. The circuits of FIGS. 11 through 14, when combined as indicated, provide C.

Figure 11:
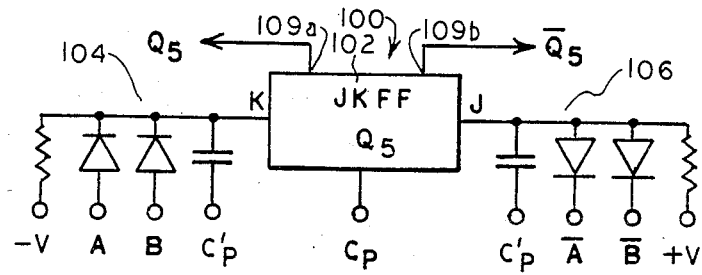

Referring now to FIG. 11, the circuit 100 thereshown includes a JK flip-flop 102, a DC logic OR gate 104, and a DC logic AND gate 106. The inputs of gate 104 are coupled to logic sources providing A and B while the inputs of gate 106 are coupled to logic sources providing $\overline{A}$ and $\overline{B}$. The minor clock pulses $C_p'$ are capacitively coupled to the J and K inputs and the major clock pulses $C_p$ are coupled to the clock input of flip-flop 102. The output 109a thereby provides $Q_5$ which is A B and the output 109b thereby provides $\overline{Q_5}$ which is $\overline{A}\ \overline{B}$.

Figure 12:
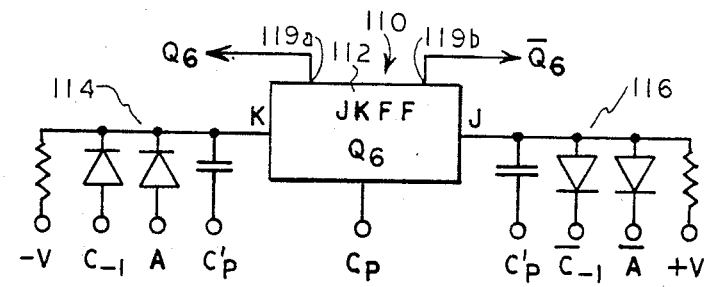

In a similar manner, the circuit 110 of FIG. 12 provides $Q_6$ which is $C_{-1}$ A at output 119a and $\overline{Q_6}$ which is $\overline{C_{-1}\ A}$; at output 119b of JK flip-flop 112. The circuit 110 includes the JK flip-flop 112, a DC logic OR gate 114 and a DC logic AND gate 116.

Figure 13:
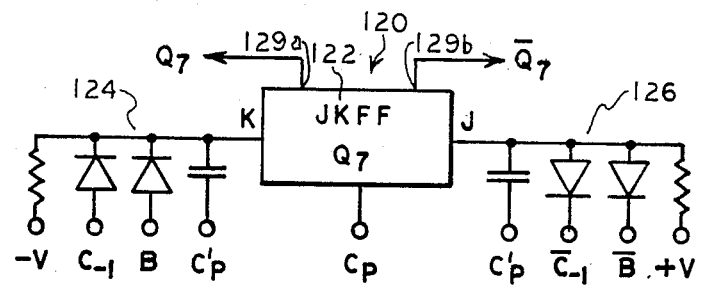

The circuit 120 of FIG. 13 provides $Q_7$ which is $\overline{C_{-1}}$ B at output 129a and $\overline{Q_7}$ which is $C_{-1}$ B at output 129b of JK flip-flop 122. The circuit 120 includes the JK flip-flop 122, a DC logic OR gate 124 and a DC logic AND gate 126.

Figure 14:
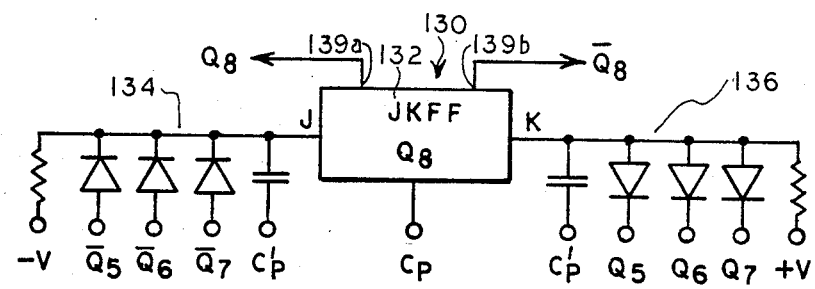

In the circuit 130 of FIG. 14, the $Q_5$, $Q_6$, $Q_7$, $\overline{Q_5}$, $\overline{Q_6}$, and $\overline{Q_7}$ outputs of the circuits 100, 110, and 120 of FIGS. 11, 12, and 13 are combined to provide $Q_8$ which is C at output 139a of JK flip-flop 132 and $\overline{Q_8}$ which is $\overline{C}$ at output 139b. The circuit 130 includes JK flip-flop 132, a DC logic OR gate 134, and a DC logic AND gate 136. The inputs of gate 134 are coupled to the outputs 109b, 119b, and 129b of circuits 100, 110, and 120, respectively. The inputs of gate 136 are coupled to the outputs 109a, 119a, and 129a of circuits 100, 110, and 120, respectively. Again, the minor clock pulses $C_p'$ are capacitively coupled to the J and K inputs of flip-flop 132 and the major clock pulses $C_p$ are coupled to the clock input of flip-flop 132.

Figure 15:
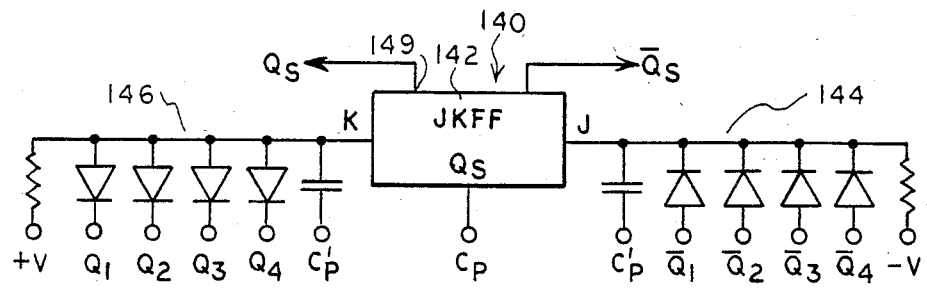

Finally, the circuit 140 of FIG. 15 provides $Q_s$ at output 149 of JK flip-flop 142. $Q_s$ is:

$$ABC(Q_1) + \overline{A}B\overline{C}(Q_2) + \overline{A}B\overline{C}(Q_3) + A\overline{B}\overline{C}(Q_4).$$

The circuit 140 includes the JK flip-flop 142, a DC logic OR gate 144 and a DC logic AND gate 146. The output of gate 144 is coupled to the J input of flip-flop 142 along with the minor clock pulses $C_p'$. Its inputs are coupled to outputs 69b, 79b, 89b, and 99b of circuits 50, 70, 80, and 90, respectively, for receiving $\overline{Q_1}$, $\overline{Q_2}$, $\overline{Q_3}$ and $\overline{Q_4}$. Similarly, the output of gate 146 is coupled to the K input of flip-flop 142 along with the minor clock pulses $C_p'$. The inputs of gate 146 are coupled to the outputs 69a, 79a, 89a, and 99a of circuits 50, 70, 80, and 90, respectively, for receiving $Q_1$, $Q_2$, $Q_3$, and $Q_4$. The major clock pulses $C_p$ are coupled to the clock input of flip-flop 142. As a result, the output 149 will provide $Q_s$.

In the operation of the circuits of FIGS. 7 through 15, the major and minor clock pulses are applied at frequency rates of at least ten megahertz. At such rates, the diodes formed from amorphous silicon alloys will be maintained in the dynamic mode of operation to obtain operation from the amorphous semiconductor devices at rates not heretofore obtainable from such devices.

Figure 16:
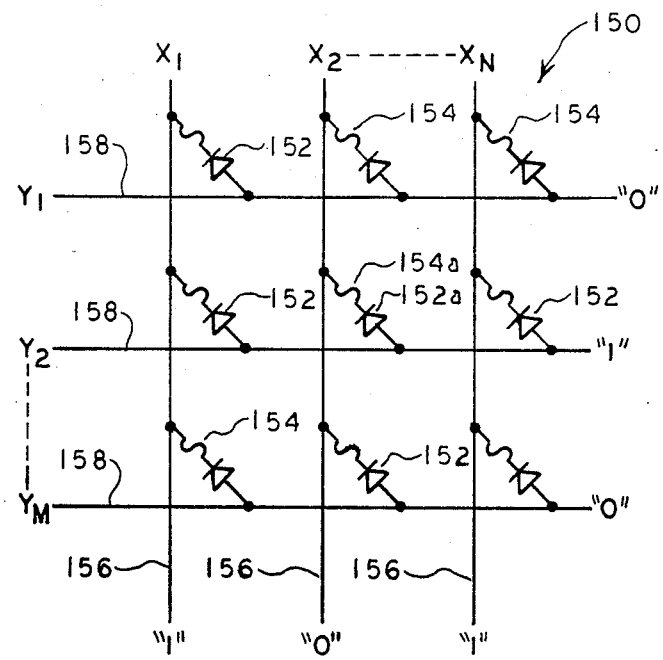
FIG. 16 is a partial circuit diagram of an electronic matrix memory array embodying the present invention.

Referring now to FIG. 16, it shows a partial circuit diagram of an electronic matrix memory array 150 wherein the diodes 152 are formed from semiconductor materials, such as amorphous silicon alloy materials, which exhibit increased switching speeds when operated in a dynamic mode. Arrays of this type are disclosed, for example, in the aforementioned copending U.S. patent application Ser. No. 458,919, or in copending U.S patent application Ser. No. 513,997, filed July 14, 1983 for Electronic Matrix Arrays And Method For Making, Parallel Reprogramming Or Field Programming The Same (now U.S. Pat. No. 4,545,111 granted Oct. 8, 1985) which is a continuation in part of application Ser. No. 458,919. The diodes 152 are arranged to form a matrix selection circuit.

In series with each diode 152 is a memory element 154 formed from phase changeable material. The diodes 152 permit the selection of an individual memory element 154 by the application of appropriately applied logic levels to a given one of a plurality of X address lines 156 and a given one of a plurality of Y address lines 158. The logic levels used can be AC logic signals as previously described for maintaining the diodes 152 in a dynamic mode of operation. For example, to select the diode 152a and memory element 154a, corresponding to position $X_2$, $Y_2$, 0 and 1 logic levels can be applied to the matrix 150 as indicated. More specifically, a logic 1 signal is applied to the $Y_2$ address line while the other Y address lines are provided with logic 0 signals. Concurrently, the $X_2$ address line is provided with a logic 0 level signal and the other X address lines are provided with a logic 1 level signal. As a result, only diode 152a will be forward biased and selected. As previously mentioned, the applied logic signals can be AC logic signals of the type illustrated in FIG. 1. These signals will maintain the diode 152 in a dynamic condition to enable high speed operation of the matrix 150.

Many modifications and variations of the present invention are possible in light of the above teachings. For example, the amorphous silicon diodes can also have an n-i-p configuration. Also, the diodes can have multiple p-i-n structures. Multiple diode structures would be desired for some operating voltage and current requirements. Also, and as can be appreciated, circuits other than a binary adder as disclosed can be utilized in practicing the present invention. By the term "amorphous" is meant an alloy or material which has long range disorder, although it can have short or intermediate order or even contain at times crystalline inclusions. It is therefore, to be understood that within the scope of the appended claims the invention can be practiced otherwise than as specifically described.

What is claimed and desired to be secured by Letters Patent of the United States is:

1. In an electronic system of the type including a plurality of digital circuits for providing one or more bits of discrete output in response to applied input signals, the improvement providing high speed operation of said electronic system, said improvement comprising:

at least some of said circuits including devices switchable between at least two states, said devices being formed at least in part from amorphous semiconductor alloy materials of the type which exhibit increased switching speeds, in comparison to switching speeds when in a static mode of operation, when maintained in a dynamic mode of operation characterized by preventing said devices from settling into an off condition for more than about two microseconds; and signal source means for applying to said system dynamic signals for maintaining said switchable devices in said dynamic mode of operation.

2. A system as defined in claim 1 wherein said amorphous semiconductor alloy materials include silicon.

3. A system as defined in claim 1 wherein said switchable devices comprise amorphous silicon diodes.

4. A system as defined in claim 3 wherein said diodes are arranged to form AND gates.

5. A system as defined in claim 3 wherein said diodes are arranged to form OR gates.

6. A system as defined in claim 1 wherein said signal source means are coupled to each of said circuits.

7. A system as defined in claim 1 wherein said signal source means includes means for applying to said system signals having a fixed frequency.

8. A system as defined in claim 1 wherein said signal source means includes means for applying to said system dynamic signals which continuously vary in amplitude selected from the group of continuously varying signals consisting of sinusoidal waveforms and sawtooth waveforms.

9. A system as defined in claim 1 wherein said dynamic signals have a frequency greater than 0.5 megahertz.

10. A system as defined in claim 1 wherein said signal source means includes a clock generator arranged to provide said dynamic signals to said system in the form of clock pulses having a frequency between ten and forty megahertz.

11. A system as defined in claim 10 wherein said clock generator is arranged to provide alternating major and minor clock pulses.

12. A system as defined in claim 1 wherein said circuits comprise logic circuits arranged to form a binary adder.

13. A system as defined in claim 1 wherein said switchable devices are arranged to form a matrix selection circuit.

14. A system as defined in claim 13 wherein said switchable devices are diodes.

15. A system as defined in claim 13 further including means for applying dynamic signals to said switchable devices.

16. A system as defined in claim 15 wherein said means for applying dynamic signals produce alternating major and minor clock pulses.

17. A system as defined in claim 14 further including means for applying dynamic signals to said diodes.

18. A system as defined in claim 17 wherein said dynamic signals are alternating major and minor clock pulses.

19. A method of operating an electronic system of the type including a plurality of digital circuits which provide one or more bits of discrete output in response to applied input signals, said method providing high speed operation of said system and comprising the steps of:

providing a plurality of devices switchable between at least two states formed at least in part from amorphous semiconductor alloy materials of the type which exhibit increased switching speeds, in comparison to switching speeds when in a static mode operation, when operated in a dynamic mode of operation characterized by preventing said devices from settling into an off condition for more than about two microseconds;

coupling said switchable devices together to form said circuits; and thereafter applying to said system dynamic signals which maintain said switchable devices in said dynamic mode of operation.

20. A method as defined in claim 19 wherein said dynamic signals are applied to said circuits.

21. A method as defined in claim 19 wherein said dynamic signals are of a fixed frequency.

22. A method as defined in claim 21 wherein said dynamic signals have a frequency between ten and forty megahertz.

23. A method as defined in claim 19 wherein said dynamic signals include alternating major and minor clock pulses.

* * * * *